(12) United States Patent
Lee

(10) Patent No.: US 7,403,044 B2  
(45) Date of Patent: Jul. 22, 2008

(54) METHOD OF PRODUCING BALANCED DATA OUTPUT

(75) Inventor: Seong-Hoon Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 114 days.

(21) Appl. No.: 11/114,130

(22) Filed: Apr. 26, 2005

(65) Prior Publication Data

US 2006/0244492 A1 Nov. 2, 2006

(51) Int. Cl.
*H03K 5/22* (2006.01)

(52) U.S. Cl. .................... 327/24; 327/294; 327/292
(58) Field of Classification Search ......... 327/291–292, 327/295–297, 24

See application file for complete search history.

(56) References Cited

U.S. PATENT DOCUMENTS

2006/0244505 A1* 11/2006 Fung et al. ................. 327/293

FOREIGN PATENT DOCUMENTS

| JP | 11015553 A | * | 6/1997 |
| JP | 02000035831 A | * | 2/2000 |

* cited by examiner

*Primary Examiner*—Dinh T. Le  
(74) *Attorney, Agent, or Firm*—Dickstein Shapiro LLP

(57) ABSTRACT

Strobe signals are coupled to a phase detector which compares rising and falling edges of the respective strobe signals. If the phase detector determines that there is a mismatch, it outputs an UP or DOWN control signal to a control circuit. The control circuit then transmits the UP or DOWN control signal to edge adjusting circuits connected to each strobe and data stream between the flip flop and pre-driver. The edge adjusting then adds a delay to each respective strobe and data stream which incrementally compensates for the mismatch created by PVT variations. The process is repeated until the high and low data outputs are effectively matched, thereby maximizing the data eye.

52 Claims, 4 Drawing Sheets

A block diagram of proposed data output  
S# and associated output circuitry could be a dummy when it is not necessary by the spec.

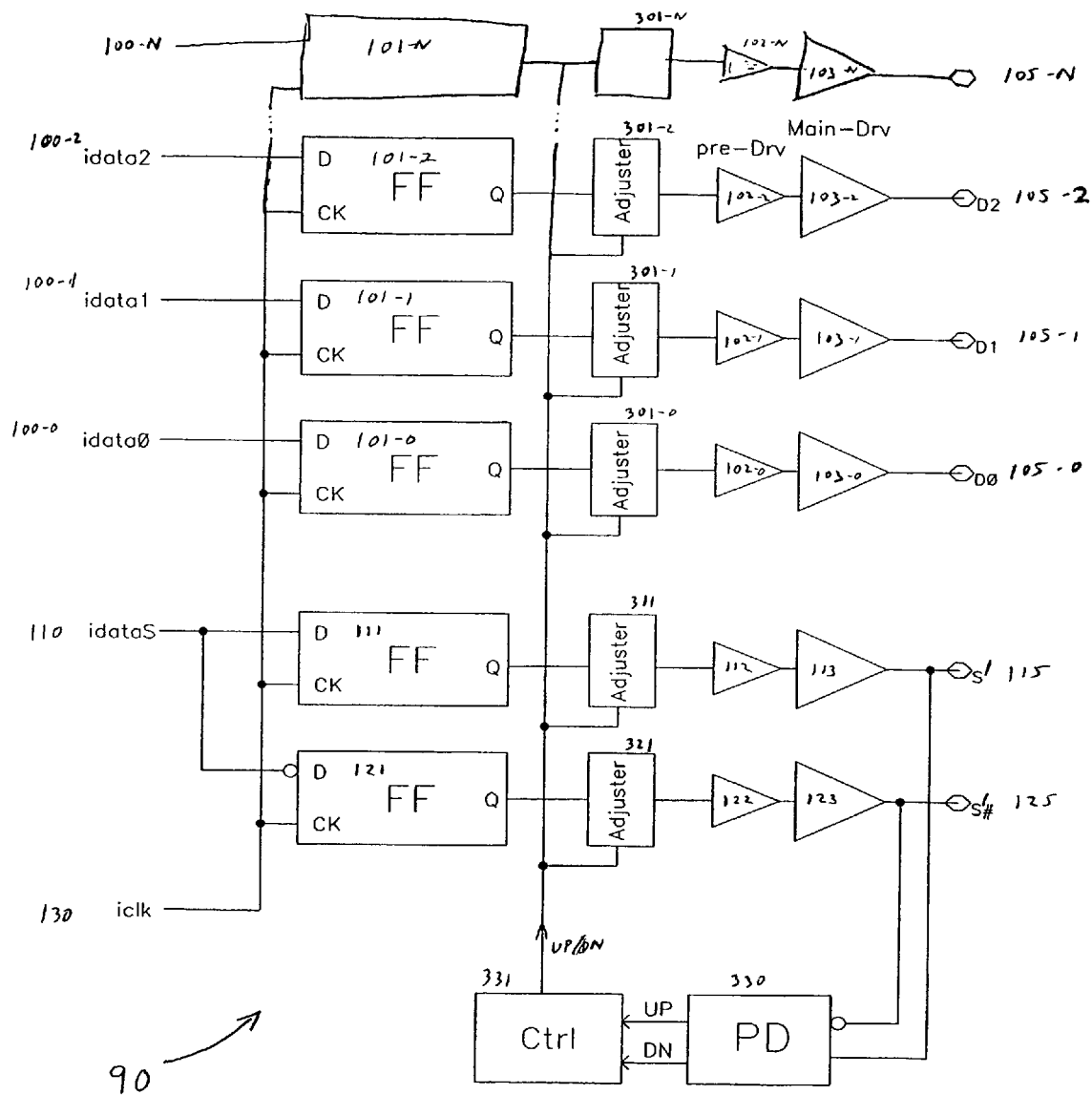
Figure 3. A block diagram of proposed data output S/# and associated output circuitry could be a dummy when it is not necessary by the spec.

METHOD OF PRODUCING BALANCED DATA OUTPUT

FIELD OF THE INVENTION

The invention relates generally to memory circuits and more particularly to reducing mismatch in high and low data propagation in data output circuitry of a digital circuit, for example, a memory circuit.

BACKGROUND OF THE INVENTION

In a conventional data output method for a strobed memory device, data streams are synchronized with one or more strobe signals. Internal data streams are latched to at least one flip-flop for output and are targeted to fire by one or more clock cycles. A pre-driver buffers the output data signals and a large sized main-driver sends the output data signals off chip.

A data window or eye represents the time between the rising and falling edges of the strobe signals. Ideally, an output data-eye will show the complementary rising and falling edges of the data streams to be well balanced. However, in many cases, there can be a mismatch between the rising and falling edges which narrows the data eye. This is undesirable because it limits the amount of time the data is valid.

This mismatch in high and low data propagation times is due to the different physical and electrical characteristics of PMOS and NMOS transistors over variations in process, voltage and temperature (PVT). These variations cannot be removed or completely compensated for over all PVT variations. As clock frequency increases, the mismatch between PMOS and NMOS transistor response becomes even more pronounced.

Referring now to FIG. 1, a block diagram of a conventional data output circuit is shown. FIG. 1 shows a plurality of data input streams 100-0, 100-1, . . . 100-N, a plurality of flip flops 101-0, 101-1, . . . 101-N, a plurality of pre-drivers 102-0, 102-1, . . . 102-N, a plurality of main drivers 103-0, 103-1, . . . 103-N, and a plurality of data output streams 105-0, 105-1, . . . 105-N. Each data input stream 100-0, 100-1, . . . 100-N is input into a respective flip flop 101-0, 101-1, . . . 101-N, each of which outputs to a respective pre-driver 102-0, 102-1, . . . 102-N. Each pre-driver 102-0, 102-1, . . . 102-N outputs to a respective main driver 103-0, 103-1, . . . 103-N, which outputs a data output stream 105-0, 105-1, . . . 105-N.

FIG. 1 also shows high-low toggling data 110 (such as a data strobe), a clock signal 130, and two additional flip flops 111, 112, pre-drivers 112, 122, and main drivers 113, 123, which produce complementary strobe signals S, S#. High-low toggling data 110 is input into flip flops 111, 121. The toggling data is inverted at the input of flip-flop 121 to produce an output signal which is complementary to an output signal of flip-flop 111. The flip-flops 111, 121 output the complementary signals to the inputs of respective pre-drivers 112, 122. Pre-drivers 112, 122 output to the inputs of respective main drivers 113, 123, which output respective complementary strobe signals S, S#. All flip flops 101-0, 101-1, . . . 101-N, 111, 112 are configured to fire responsive to the clock signal 130.

In many cases only one strobe signal S is needed to manage the data streams 105-0, 105-1, . . . 105-N. As a result, the complementary strobe S# circuitry 121, 122, 123 is often omitted.

Under ideal conditions, the rising and falling edges of the strobe signals are matched, as shown in FIG. 2(a). However, as discussed above, PVT variations affect PMOS and NMOS transistors differently. Many times, the edges are skewed as shown in FIGS. 2(b) and 2(c), reducing the data window or eye. As a result data output efficiency is reduced.

There is a need and desire for a method of reliably balancing high and low data outputs in a strobed data circuit, e.g., a memory circuit, so as to maximize the usable data eye. Similarly, there is a need and desire for reliably compensating for an existing mismatch in high and low data outputs.

BRIEF SUMMARY OF THE INVENTION

The current invention relates to a method of balancing high and low data outputs in a strobed data circuit, e.g., a memory circuit, by matching their propagation delays using a closed loop control circuit.

Strobe signals are coupled to a phase detector that compares rising and falling edges of the strobe signals. If the phase detector determines that there is a mismatch, it outputs an UP or DOWN control signal to a control circuit, which then selectively transmits the UP or DOWN control signal to edge adjusting circuits connected to each strobe and data stream. The edge adjusting then adjusts a delay to each strobe and data stream, which incrementally compensates for the mismatch created by PVT variations. The process is repeated until the high and low data outputs are effectively matched, thereby maximizing the data eye.

BRIEF DESCRIPTION OF THE DRAWINGS

The foregoing and other advantages and features of the invention will become more apparent from the detailed description of exemplary embodiments provided below with reference to the accompanying drawings in which:

FIG. 3 is a block diagram of a data output circuit according to the present invention;

DETAILED DESCRIPTION OF THE INVENTION

Figure 1:
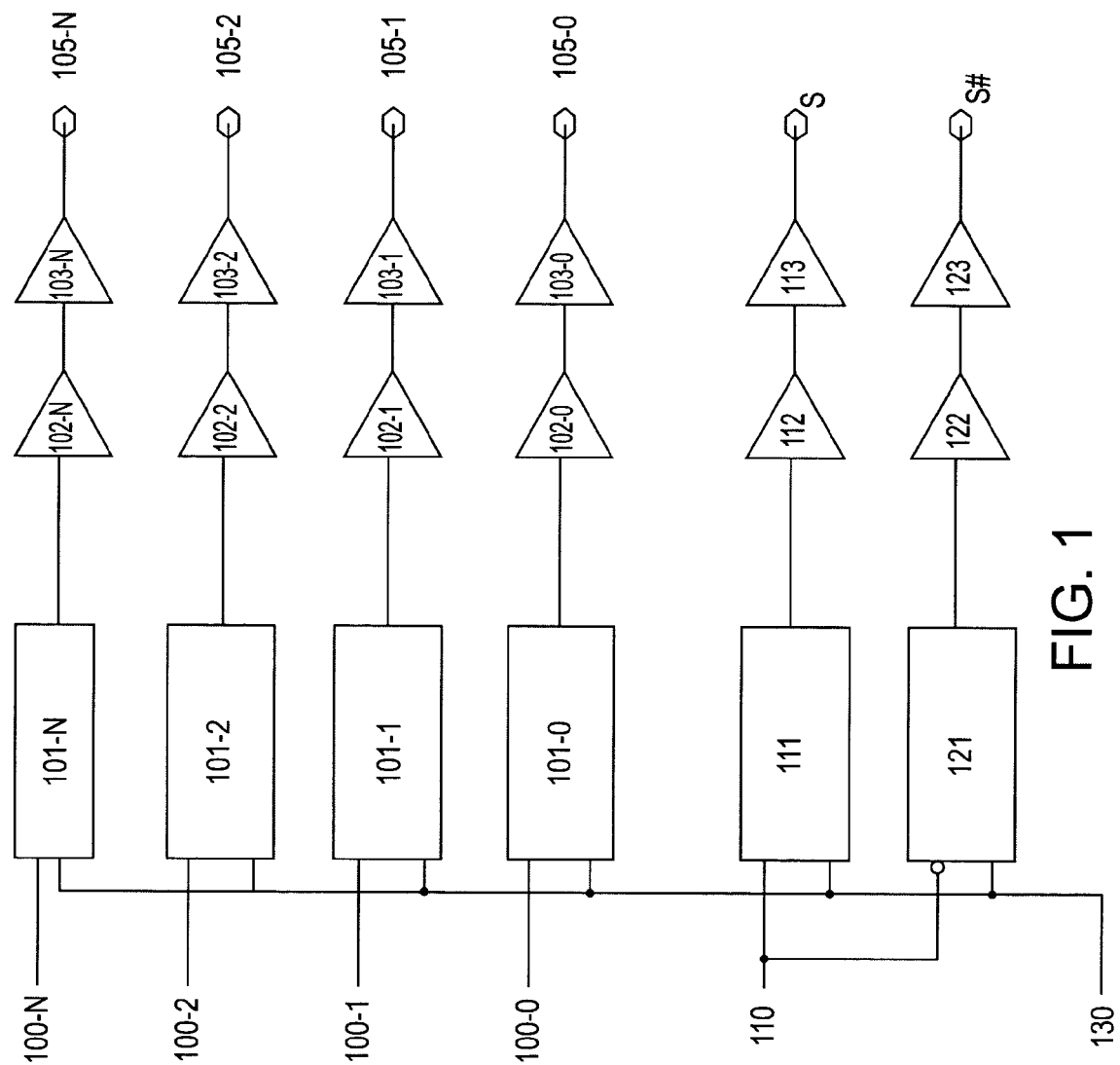
FIG. 1 is a block diagram of conventional single ended data output circuit.
Figures 2A, 2B, 2C:
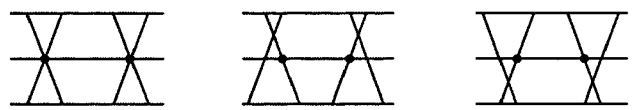
FIGS. 2(a), 2(b) and 2(c) are diagrams showing examples of matched and mismatched data eyes.

Referring now to FIG. 3, a block diagram of a data output circuit 90 is shown according to an exemplary embodiment of the present invention. As in FIG. 1, FIG. 3 shows a plurality of data input streams 100-0, 100-1, . . . 100-N, a plurality of flip flops 101-0, 101-1, . . . 101-N, a plurality of pre-drivers 102-0, 102-1, . . . 102-N, a plurality of main drivers 103-0, 103-1, . . . 103-N, and a plurality of data output streams 105-0, 105-1, . . . 105-N. FIG. 3 also shows a plurality of edge adjusting circuits 301-0, 301-1, . . . 301-N. Each data input stream 100-0, 100-1, . . . 100-N is input into a respective flip flop 101-0, 101-1, . . . 101-N, each of which has an output connected to the input of a respective edge adjusting circuit 301-0, 301-1, . . . 301-N. Each edge adjusting circuit 301-0, 301-1, . . . 301-N outputs to a respective pre-driver 102-0, 102-1, . . . 102-N. Each pre-driver 102-0, 102-1, . . . 102-N outputs to a respective main driver 103-0, 103-1, . . . 103-N, which outputs a data output stream 105-0, 105-1, . . . 105-N.

FIG. 3, like FIG. 1, also shows high-low toggling data 110, a clock signal 130, and two additional flip flops 111, 112, pre-drivers 112, 122, and main drivers 113, 123, which produce complementary strobe signals S, S#. High-low toggling data 110 is input into flip flops 111, 121. The toggling data is inverted at the input of flip-flop 121 to produce an output signal which is complementary to an output signal of flip-flop 111. The flip-flops 111, 121 output the complementary signals to pre-drivers 112, 122, which output to respective main drivers 113, 123. Main drivers 113, 123 output respective complementary strobe signals S, S#. All flip flops 101-0, 101-1, . . . 101-N, 111, 112 are configured to fire responsive to the clock signal 130.

FIG. 3 also shows edge adjusting circuits 311, 321, phase detector 330, and control circuit 331. The inputs of phase detector 330 are respectively connected to the outputs of main drivers 113, 123. The input of control circuit 331 is connected to UP and DOWN outputs of phase detector 330. The output of control circuit 331 is connected to inputs of edge adjusting circuits 301-0, 301-1, . . . 301-N, 311, 321.

When complementary strobe signals S, S# are output from the main drivers 113, 123, they are compared by the phase detector 330. Specifically, the phase detector 330 compares the rising and falling edges of the strobe signals S, S# to determine whether the strobe signals S, S#, and thus the corresponding data outputs 105-0, 105-1, . . . 105-N, are matched or skewed. If the edges of strobe signals S, S# are matched, the phase detector 330 does not send a control signal to the control circuit 331 and neither the data outputs 105-0, 105-1, . . . 105-N nor the strobe signals S, S# are adjusted.

However, if the phase detector 330 detects a skew, the phase detector 330 outputs an UP or DOWN control signal to control circuit 331. The control circuit 331, responsive to the UP or DOWN control signals, sends an edge adjustment signal to the edge adjusting circuits 301-0, 301-1, . . . 301-N, 311, 321. The edge adjustment signal causes the respective edge adjusting circuits 301-0, 301-1, . . . 301-N, 311, 321 to incrementally adjust an edge of the respective signals generated from flip flops 101-0, 101-1, . . . 101-N.

The newly adjusted strobe signals S', S'# 115, 125 are again analyzed by the phase detector 330. If the phase detector 330 determines that a mismatch is still present, it sends another UP or DOWN control signal to the control circuit 331 and induces another incremental edge adjustment in strobe signals S', S'# 115, 125 and respective data outputs 105-0, 105-1, . . . 105-N. This process may be repeated indefinitely, whether or not a mismatch is detected, and allows on-the-fly mismatch detection and adjustment of the data eye whenever a mismatch is detected.

Figure 4:
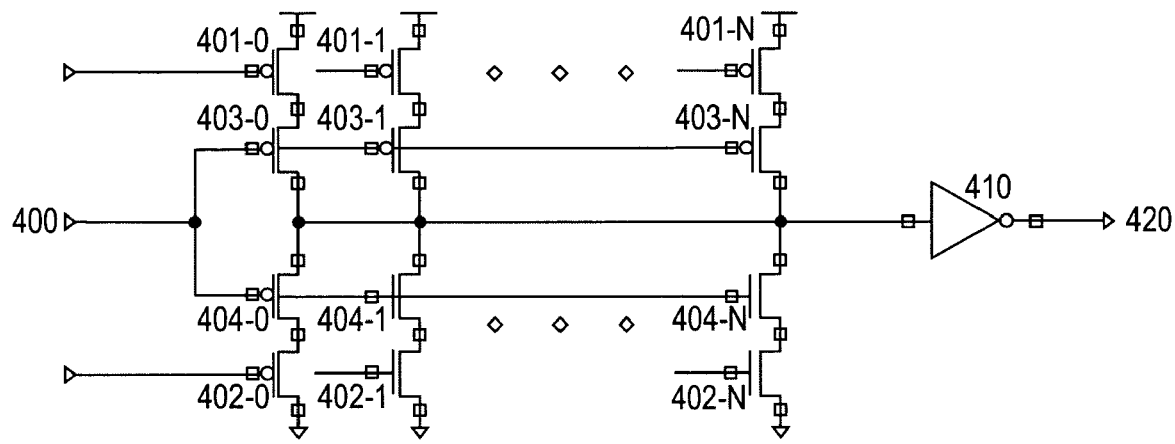
FIG. 4 is a digital edge adjusting circuit according to the present invention.

An example of a digital edge adjusting circuit is shown in FIG. 4. An input line 400, a plurality of pull up transistors 401-0, 401-1, . . . 401-N for receiving UP signals pu#<0:n> from the control circuit 331, and pull down transistors 402-0, 402-1, . . . 402-N for receiving down signals pd<0:n> from the control circuit 331. Two series connected output adjusting transistors 403-0, 403-1, . . . 403-N and 404-0, 404-1, . . . 404-N are connected between corresponding up and down transistors 401-0, 401-1, . . . 401-N, 402-0, 402-1, . . . 402-N. FIG. 4 also shows an inverter 410 and output line 420.

The control circuit 331 keeps a tally, with an integrated counter, for example, of each UP and DOWN signal, received from the phase detector 330 after each comparison, and generates n+1-bit codes, which activate a specified number n of respective up or down transistors 401-0, 401-1, . . . 401-N, 402-0, 402-1, . . . 402-N when received by the inputs of the edge adjusting circuit. An n+1-bit UP signal, with n representing an integer between 1 and N, activates n up transistors 401-0, 401-1, . . . 401-n, which induces n respective output adjusting transistors 403-0, 403-1, . . . 403-n to increase the node voltage comprising the input to the amplifier 410. Likewise An n+1-bit DOWN signal activates n down transistors 402-0, 402-1, . . . 402-n, which induces n respective output adjusting transistors 404-0, 404-1, . . . 404-n to decrease the node voltage feeding into the amplifier 410.

Figure 5A:
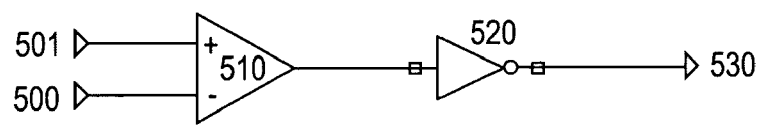
FIG. 5(a) is an analog edge adjusting circuit according to the present invention.
Figure 5B:
FIGS. 5(b) and 5(c) are diagrams showing the change in output signal based on changes in the reference signal.
Figure 5C:
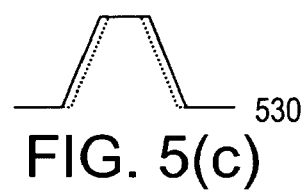

FIG. 5(a) shows an analog edge adjusting circuit. Input voltage 500 and reference voltage 501 feed into a differential amplifier 510. An inverter 520 inverts the output of the differential amplifier and generates output signal 530. An UP or DOWN signal from the control circuit 331 adjusts the reference voltage 501 up or down, as shown in FIG. 5(b). The change in reference voltage affects the result produced by the differential amplifier 510 and ultimately the output signal 530. As the reference voltage 501 rises, for example, the distance between rising and falling edges of the output signal 530 tightens as shown in FIG. 5(c). Likewise, if the reference voltage 501 is lowered by a DOWN control signal, the output signal 530 widens out.

Figure 6:
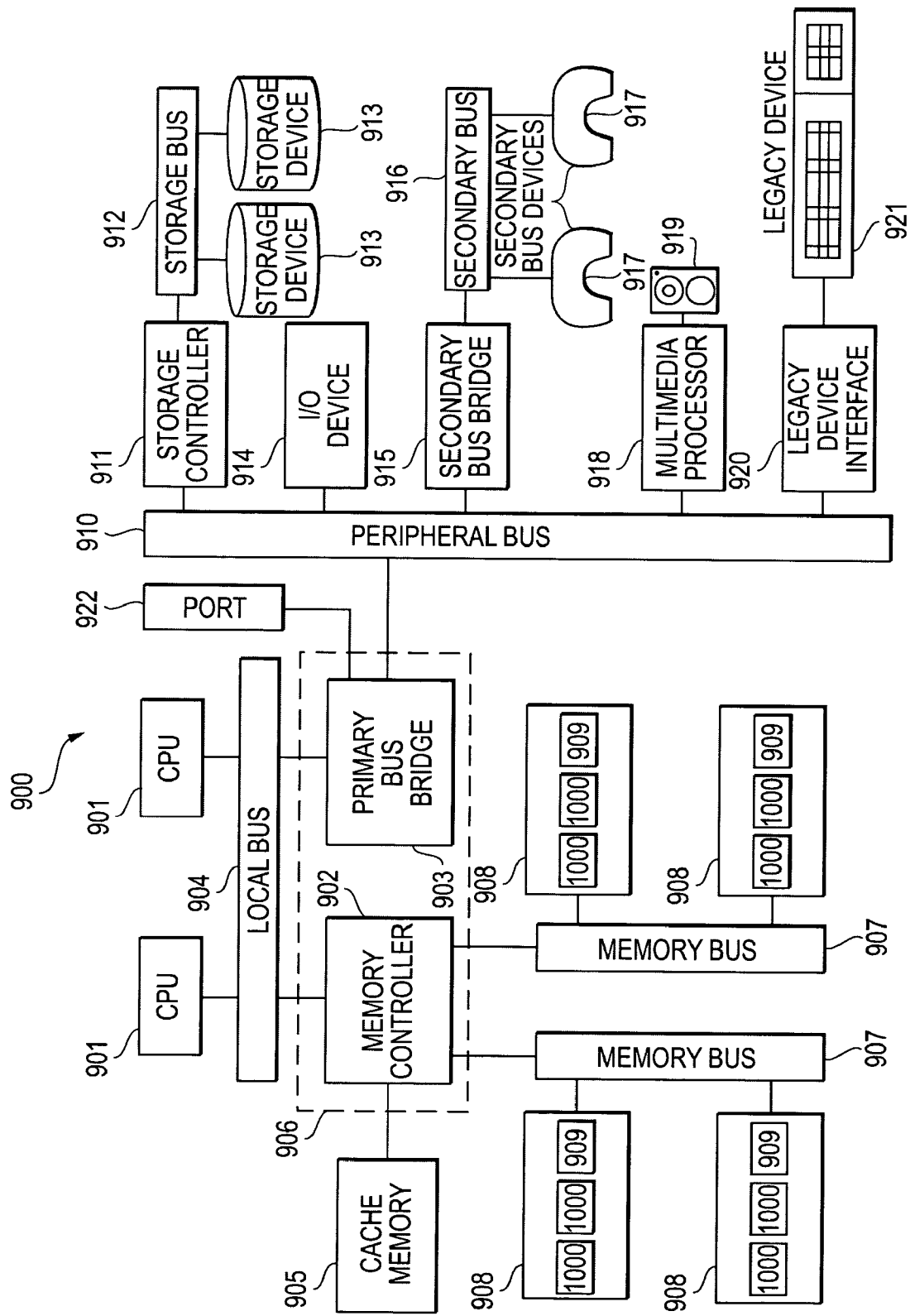
FIG. 6 shows a block diagram illustrating use of a data output circuit as described herein in a processor system in accordance with the invention.

FIG. 6 illustrates an exemplary processor system 900, which includes one or more memory devices 1000 utilizing the data output circuit 90 (shown in FIG. 3) of the present invention. The processor system 900 can include one or more CPUs 901 coupled to a local bus 904. A memory controller 902 and a primary bus bridge 903 can also be coupled the local bus 904. The processor system 900 can include multiple memory controllers 902 and/or multiple primary bus bridges 903. The memory controller 902 and the primary bus bridge 903 may be integrated as a single device 906.

The memory controller 902 can also be coupled to one or more memory buses 907. Each memory bus accepts memory components 908, which include at least one memory device 1000 containing a data output circuit utilizing the present invention. The memory components 908 may be a memory card or a memory module. Some examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 can be coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and a legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 can couple one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 can be used to couple legacy devices; for example, older styled keyboards and mice, to the processing system 900.

The processing system 900 illustrated in FIG. 6 is only an exemplary processing system with which the invention may be used. While FIG. 6 illustrates a processing architecture especially suitable for a general purpose computer, such as a personal computer or a workstation, it should be recognized that well known modifications can be made to configure the processing system 900 to become more suitable for use in a variety of applications. For example, many electronic devices, which require processing may be implemented using a simpler architecture, which relies on a CPU 901, coupled to memory components 908 and/or memory devices 1000. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The above description and drawings are only to be considered illustrative of exemplary embodiments which achieve the features and advantages of the invention. Modification of, and substitutions to, specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A method for reducing skewed data, said method comprising:
    inputting into a first flip-flop a strobe signal that toggles between first and second reference voltage levels;
    inputting into a second flip-flop a complement of the strobe signal;
    comparing an edge of an output of the first flip-flop to a corresponding edge of an output of the second flip-flop;
    determining whether the edge of the output of the first flip-flop and the edge of the output of the second flip-flop match;
    if it is determined that the edges do not match, adjusting at least one of the outputs of the first and second flip-flops with an edge adjusting circuit; and
    providing at least one adjusted strobe signal, wherein the at least one adjusted strobe signal is the output of the at least one edge adjusting circuit.

2. The method of claim 1, further comprising the step of:
    providing at least one data output stream responsive to the at least one adjusted strobe signal.

3. The method of claim 2, wherein the adjusting step comprises the act of adjusting at least one of the outputs of the first and second flip-flops by adding a delay thereto.

4. The method of claim 3, further comprising the step of adjusting at least one data input stream with the same adjustment as at least one of the outputs of the first and second flip-flops.

5. The method of claim 4, further comprising the step of providing a plurality of data output streams, the plurality of data output streams comprising a plurality of data input streams adjusted with the same adjustment as applied to at least one of the outputs of the first and second flip-flops.

6. The method of claim 1, wherein the determining step further comprises determining if a rising edge of the output of the first flip-flop occurs before a falling edge of the output of the second flip-flop.

7. The method of claim 6, wherein the adjusting step further comprises:
    generating at least one of an UP or DOWN control signal responsive to the step of determining if a rising edge of the output of the first flip-flop occurs before a falling edge of the output of the second flip-flop.

8. The method of claim 7, wherein the act of adjusting at least one of the outputs of the first and second flip-flops is responsive to the at least one UP or DOWN control signal.

9. The method of claim 1, further comprising the act of repeating the comparing and determining steps after adjusting at least one of the outputs of the first and second flip-flops.

10. The method of claim 7, wherein:
    the act of determining further comprises the act of measuring a degree of mismatch between the edges of the outputs of the first and second flip-flops; and
    the act of adjusting further comprises activating at least one adjustment transistor responsive to the degree of mismatch, wherein the at least one adjustment transistor provides a signal for adjusting a delay of at least one of the outputs of the first and second flip-flops.

11. The method of claim 7, wherein:
    the act of determining further comprises the act of measuring a degree of mismatch between the edges of the outputs of the first and second flip-flops; and
    the act of adjusting further comprises:
        comparing the at least one of the outputs of the first and second flip-flops with a reference signal, the reference signal being responsive to the at least one UP or DOWN control signal;
        inverting a result of the comparison; and
        outputting a result of the inversion.

12. A method of reducing skewed data comprising:
    comparing edges of outputs of a pair of flip-flops, wherein inputs of the pair of flip-flops are complementary strobe signals;
    producing one of an UP and DOWN control signal based on the comparison;
    generating an edge adjustment signal responsive to the UP or DOWN control signal;
    adjusting edges of a plurality of data output streams and at least one of the outputs of the pair of flip-flops responsive to the edge adjustment signal.

13. The method of claim 12, wherein:
    the act of comparing further comprises measuring a degree of mismatch between the edges of the outputs of the pair of flip-flops; and the act of adjusting further comprises activating at least one adjustment transistor for each of the respective data output streams and the outputs of the pair of flip-flops, said activation being responsive to the degree of mismatch.

14. The method of claim 12, wherein:

the act of comparing further comprises measuring a degree of mismatch between the edges of the outputs of the pair of flip-flops; and act of adjusting further comprises:

comparing each of the data output streams and the outputs of the pair of flip-flops with a reference signal, the reference signal being responsive to the edge adjustment control signal;

inverting each respective result of the comparison of the reference signal and the respective data output streams and the outputs of the pair of flip-flops; and outputting a result of each respective inversion.

15. A data output circuit comprising:

a first flip-flop, wherein an input of the first flip-flop is a first strobe signal that toggles between first and second reference voltage levels;

a second flip-flop, wherein an input of the second flip-flop is a second strobe signal that toggles between the first and second reference voltage levels, wherein the second strobe signal is a complement of the first strobe signal;

at least one data output circuit configured to provide a data output stream;

a phase detector coupled to outputs of the first and second flip-flops, the phase detector being configured to compare an edge of the output of the first flip-flop to an edge of the output of the second flip-flop and to determine whether the edges of the outputs of the first and second flip-flops match; and at least one edge adjusting circuit coupled to the at least one data output circuit and the outputs of the first and second flip-flops, the at least one edge adjusting circuit being configured to adjust at least one output of the first and second flip-flops responsive to the comparison, and the at least one edge adjusting circuit being configured to adjust the at least one data output stream responsive to the phase detector.

16. The circuit of claim 15, wherein the phase detector is further configured to determine the degree to which the edges of the outputs of the first and second flip-flops correspond.

17. The circuit of claim 16, wherein the at least one edge adjusting circuit is further configured to adjust an edge of at least one of the outputs of the first and second flip-flops.

18. The circuit of claim 15, wherein the at least one edge adjusting circuit is further configured to adjust the at least one data output stream with the same adjustment applied to the at least one output of the first and second flip-flops.

19. The circuit of claim 18, wherein the at least one edge adjusting circuit is further configured to adjust a plurality of data output streams with the same adjustment applied to the at least one output of the first and second flip-flops.

20. The circuit of claim 15, wherein the phase detector is further configured to determine if a rising edge of the output of the first flip-flop occurs before a falling edge of the output of the second flip-flop.

21. The circuit of claim 20, further comprising:

a control circuit coupled to the phase detector and to a plurality of edge adjusting circuits, the plurality of edge adjusting circuits coupled to the outputs of the first and second flip-flops and the at least one data output circuit, the control circuit being configured to generate an edge adjustment signal responsive to the phase detector.

22. The circuit of claim 21, wherein at least one of the plurality of edge adjusting circuits is configured to adjust an edge of at least one of the outputs of the pair of flip-flops responsive to the edge adjustment signal.

23. The circuit of claim 15, wherein the phase detector is configured to periodically compare the outputs of the first and second flip-flops.

24. The circuit of claim 21, wherein:

the phase detector is further configured to measure a degree of mismatch between the edges of the outputs of the first and second flip-flops; and the plurality of edge adjusting circuits each comprise at least one adjustment transistor, the at least one adjustment transistor being responsive to the degree of mismatch.

25. The circuit of claim 21, wherein:

the phase detector is further configured to measure a degree of mismatch between the edges of the outputs of said first and second flip-flops and generate at least one UP or DOWN control signal responsive to the degree of mismatch; and said control circuit is further configured to generate a reference signal responsive to said the at least one control signal; and the at least one edge adjusting circuit is further configured to:

compare the at least one output of the first and second flip flops with the reference signal;

invert a result of the comparison; and output a result of the inversion.

26. A data output system comprising:

a CPU;

a first strobe circuit connected to said CPU for generating a first strobe signal that toggles between first and second reference voltage levels;

a second strobe circuit for generating a second strobe signal that toggles between said first and second reference voltage levels, wherein the second strobe signal is a complement of the first strobe signal;

at least one data output circuit responsive to said CPU and configured to output a data signal responsive to said first strobe circuit;

a phase detector coupled to outputs of said first and second strobe circuits, said phase detector being configured to compare an edge of the first strobe signal to an edge of the second strobe signal and to determine whether the edges of said first and second strobe signals match; and at least one edge adjusting circuit coupled to to said strobe circuits, said at least one edge adjusting circuit being configured to adjust at least one of said first and second strobe signals responsive to said phase detector.

27. The system of claim 26, wherein said phase detector is further configured to determine whether one of said first and second strobe signals toggles before the other.

28. The system of claim 27, wherein said at least one edge adjusting circuit is further configured to adjust an edge of at least one of said first and second strobe signals.

29. The system of claim 26, wherein said at least one edge adjusting circuit is further configured to adjust at least one data output stream with the same adjustment applied to said at least one strobe signal.

30. The system of claim 29 wherein said at least one edge adjusting circuit is further configured to adjust a plurality of data output streams with the same adjustment applied to said at least one strobe signal.

31. The system of claim 26 wherein said phase detector is further configured to determine if a rising edge of said first strobe signal occurs before a falling edge of said second strobe signal.

32. The system of claim 31 further comprising a control circuit coupled to said phase detector and to said strobe circuits and said at least one data output circuit, said control circuit being configured to generate an edge adjustment signal responsive to said phase detector.

33. The system of claim 32 wherein said at least one edge adjusting circuit is configured to adjust an edge of at least one of said first and second strobe signals responsive to said edge adjustment signal.

34. The system of claim 26 wherein said phase detector is configured to periodically compare said first and second strobe signals.

35. The system of claim 32 wherein:
said phase detector is further configured to measure a degree of mismatch between the edges of said first and second strobes; and
said at least one edge adjusting circuit comprises at least one adjustment transistor, said at least one adjustment transistor being responsive to said degree of mismatch.

36. The system of claim 32 wherein:
said phase detector is further configured to measure a degree of mismatch between the edges of said first and second strobes and generate at least one UP or DOWN control signal responsive to said degree of mismatch;
said control circuit is further configured to generate a reference signal responsive to said at least one UP or DOWN control signal; and
said at least one edge adjusting circuit is further configured to:
compare said at least one strobe signal with said reference signal;
invert a result of said comparison; and
output a result of said inversion.

37. A data output circuit comprising:
first and second strobe circuits configured to generate first and second complementary strobe outputs;
a plurality of data output circuits each configured to provide a data signal responsive to one of said first and second strobe outputs;
a phase detector circuit for comparing edges of said first and second strobe outputs and for producing one of an UP and DOWN control signal based on said comparison;
a control circuit for generating an adjustment signal responsive to said UP and DOWN control signal;
a plurality of edge adjusting circuits for adjusting edges of a plurality of data outputs and said outputs of said complementary strobes responsive to said adjustment signal, each edge adjusting circuit being connected to said control circuit and also being connected to a respective one of said strobe circuits and data output circuits.

38. The circuit of claim 37, wherein:
said phase detector is further configured to measure a degree of mismatch between the edges of said first and second strobes; and
said plurality of edge adjusting circuits each comprise at least one adjustment transistor, said at least one adjustment transistor being responsive to said degree of mismatch.

39. The circuit of claim 37, wherein:
said phase detector is further configured to measure a degree of mismatch between the edges of said first and second strobes;

said control circuit is further configured to generate a reference signal responsive to said degree of mismatch; and
said plurality of edge adjusting circuits are further configured to:
compare each of said respective strobe output and data output with said reference signal;
invert each respective result of said comparison of said reference signal and said respective strobe output and data output; and
output a result of each said respective inversion.

40. A data output system comprising:
a CPU;
first and second strobe circuits configured to generate first and second complementary strobe outputs;
a plurality of data output circuits responsive to said CPU and each configured to generate a data output signal responsive to one of said first and second strobe outputs;
a phase detector circuit for comparing edges of said first and second strobe outputs and for producing one of an UP and DOWN control signal based on said comparison;
a control circuit for generating an adjustment signal responsive to said UP and DOWN control signal;
a plurality of edge adjusting circuits for adjusting edges of a plurality of data outputs and said outputs of said complementary strobes responsive to said adjustment signal, each edge adjusting circuit being connected to said control circuit and also being connected to a respective one of said strobe circuits and data output circuits.

41. The system of claim 40, wherein:
said phase detector is further configured to measure a degree of mismatch between the edges of said first and second strobes; and
said plurality of edge adjusting circuits each comprise at least one adjustment transistor, said at least one adjustment transistor being responsive to said degree of mismatch.

42. The system of claim 40, wherein:
said phase detector is further configured to measure a degree of mismatch between the edges of said first and second strobes;
said control circuit is further configured to generate a reference signal responsive to said degree of mismatch; and
said plurality of edge adjusting circuits are further configured to:
compare each of said respective strobe output and data output with said reference signal;
invert each respective result of said comparison of said reference signal and said respective strobe output and data output; and
output a result of each said respective inversion.

43. A method of reducing skewed data, the method comprising:
providing a first strobe signal that toggles between first and second reference voltage levels;
providing a second strobe signal that toggles between the first and second reference voltage levels, wherein the second strobe signal is a complement of the first strobe signal;
receiving at least one data input stream;
providing at least one data output stream corresponding to the at least one data input stream; and
concurrently with providing the at least one data output stream:
comparing an edge of the first strobe signal to a corresponding edge of the second strobe signal;

determining whether the edges of the first and second strobe signals match;

if it is determined that the edges do not match, adjusting at least one of the first and second strobe signals with at least one edge adjusting circuit; and outputting at least one adjusted strobe signal, wherein the edge adjusted strobe signal is the output of the at least one edge adjusting circuit, wherein the at least one data output stream is responsive to the at least one adjusted strobe signal.

44. The method of claim 43, wherein the adjusting step comprises the act of adjusting at least one of the first and second strobe signals by adding a delay thereto.

45. The method of claim 44, further comprising the step of adjusting the at least one data input stream with the same adjustment as at least one of said first and second strobe signals.

46. The method of claim 45, wherein
the at least one data input stream is a plurality of data input streams, and
the at least one data output stream is a plurality of data output streams,
the method further comprising the steps of:
adjusting the plurality of data input streams with the same adjustment as at least one of said first and second strobe signals; and
providing the plurality of data output streams, wherein the data output streams comprise the respective data input streams adjusted with the same adjustment as at least one of said first and second strobe signals.

47. The method of claim 43, wherein the determining step further comprises determining if a rising edge of said first strobe signal occurs before a falling edge of said second strobe signal.

48. The method of claim 47, wherein the determining step further comprises generating one of UP and DOWN control signals responsive to determining if the rising ride of the first strobe signal occurs before the falling edge of the second strobe signal.

49. The method of claim 48, wherein the act of adjusting at least one of the first and second strobe signals is responsive to the UP or DOWN control signal.

50. The method of claim 43, further comprising the act of repeating said comparing and indicating steps after adjusting at least one of the first and second strobe signals.

51. The method of claim 48, wherein:
the act of determining further comprises measuring a degree of mismatch between the edges of the first and second strobes; and
the act of adjusting further comprises activating at least one adjustment transistor responsive to the degree of mismatch, wherein the at least one adjustment transistor provides a signal for adjusting a delay of at least one of the first and second strobe signals.

52. The method of claim 48, wherein:
the act of determining further comprises the act of measuring a degree of mismatch between the edges of the first and second strobes; and
the act of adjusting further comprises:
comparing the at least one strobe signal with a reference signal, the reference signal being responsive to the UP or DOWN control signal;
inverting a result of the comparison; and
outputting a result of the inversion.

* * * * *

UNITED STATES PATENT AND TRADEMARK OFFICE
CERTIFICATE OF CORRECTION

PATENT NO.        : 7,403,044 B2                                    Page 1 of 1
APPLICATION NO.   : 11/114130
DATED             : July 22, 2008
INVENTOR(S)       : Lee It is certified that error appears in the above-identified patent and that said Letters Patent is hereby corrected as shown below:

In column 7, line 9, in Claim 14, before "act" insert -- the --.

In column 8, line 50, in Claim 26, before "said" delete "to".

Signed and Sealed this

Thirtieth Day of September, 2008

JON W. DUDAS
*Director of the United States Patent and Trademark Office*